United States Patent [19]

Ueno et al.

[11] Patent Number: 4,853,695

[45] Date of Patent: Aug. 1, 1989

[54] DATA INPUT DEVICE HAVING SWITCH MATRIX SCANNING MEANS

[75] Inventors: Hideo Ueno, Nagoya; Satoshi Shibata; Keiko Yamada, both of Aichi, all of Japan

[73] Assignee: Brother Kogyo Kabushiki Kaisha, Japan

[21] Appl. No.: 193,795

[22] Filed: May 13, 1988

[30] Foreign Application Priority Data

May 19, 1987 [JP] Japan .................. 62-122224

[51] Int. Cl.⁴ ...................... H03M 11/00; G06F 3/02
[52] U.S. Cl. ................................ 341/26; 340/825.79; 400/479
[58] Field of Search ............ 340/365 S, 365 C, 365 E, 340/825.79; 400/479, 477; 341/24, 26, 33

[56] References Cited

U.S. PATENT DOCUMENTS

| | | | |
|---|---|---|---|
| 4,149,096 | 4/1979 | Holzner et al. ................. | 340/825.79 |
| 4,398,181 | 8/1983 | Yamamoto . | |
| 4,599,608 | 7/1986 | Matsuoka ........................ | 340/365 S |
| 4,675,653 | 6/1987 | Priestley ........................... | 340/365 S |
| 4,684,275 | 8/1987 | Matsushita et al. ................ | 400/479 |

Primary Examiner—Donald J. Yusko
Assistant Examiner—Tyrone Queen
Attorney, Agent, or Firm—Oliff & Berridge

[57] ABSTRACT

A data input device having key switches which are temporarily in an operated position, and position-hold switches each having selectable stable positions. The device includes a first matrix, a second matrix, and a matrix scanning arrangement. The first matrix comprises first and second signal lines which cross each other, and the second matrix comprises third and fourth signal lines which cross each other. Each key switch is connected between the first and second lines at a corresponding one of the intersections. Similarly, each position-hold switch is connected between the third and fourth lines at a corresponding one of the intersections. Some of the first or second lines are used as the third or fourth lines. The matrix scanning arrangement scans the first matrix to determine whether each key switch as been operated, and scans the second matrix to determine the selected stable positions of each position-hold switch, only when a scanning of the first matrix indicates that the number of the key switches which have been operated is not greater than a reference value.

8 Claims, 4 Drawing Sheets

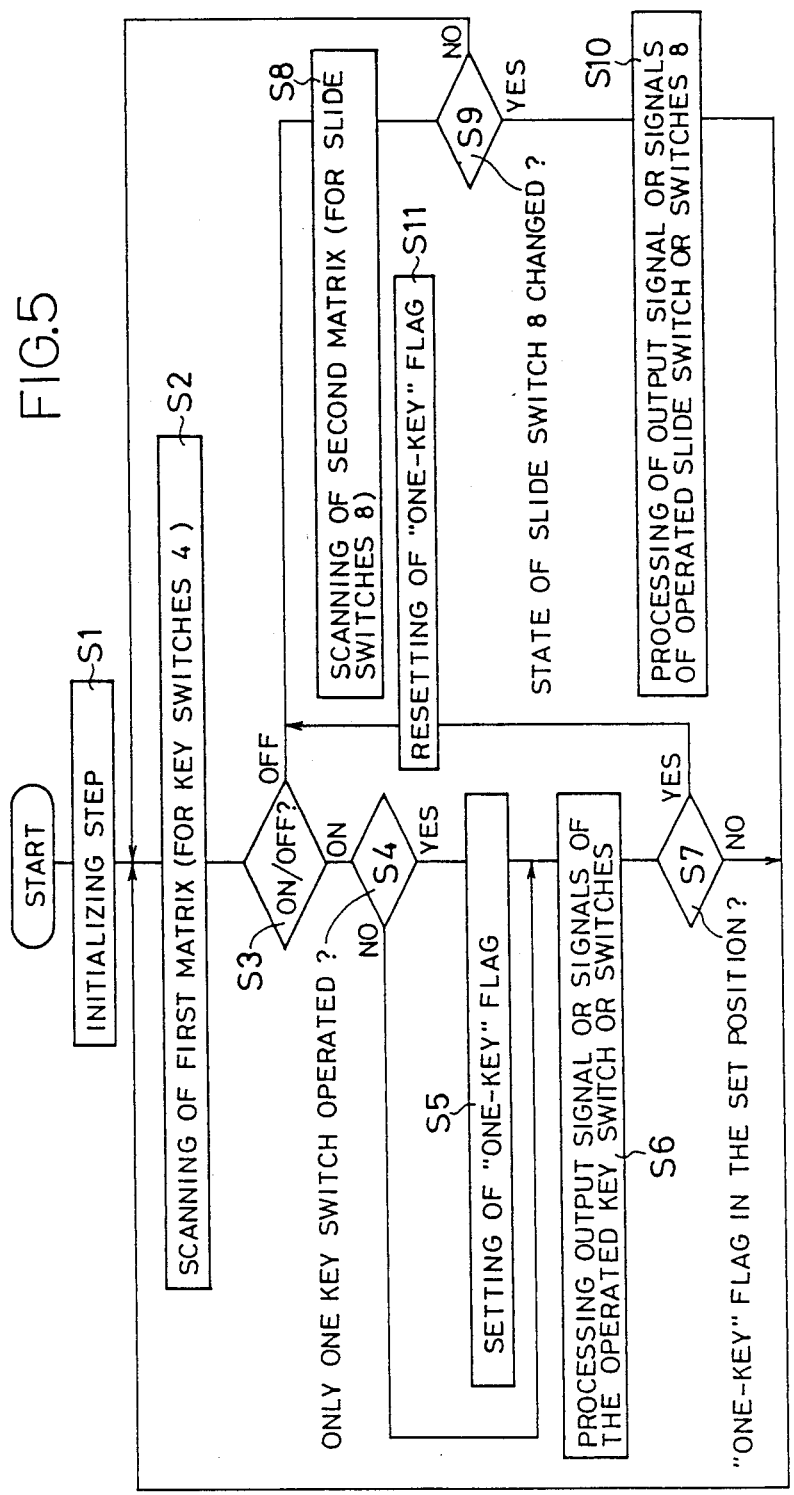

DATA INPUT DEVICE HAVING SWITCH MATRIX SCANNING MEANS

BACKGROUND OF THE INVENTION

1. Field of the Invention

The present invention relates to a data input device having a switch matrix arrangement for detecting operated switches.

2. Discussion of the Prior Art

A keyboard of a typewriter is an example of an element which constitutes a data input device. The keyboard is equipped with a multiplicity of key switches (generally called keys), which are operated to enter data such as letters and symbols. The key switches produce output signals while the switches are held in their operated or depressed position. The keyboard may be equipped with some position-hold switches in addition to the multiple key switches. These position-hold switches have two or more stable positions and are held in a selected one of the stable positions. The position-hold switches produce output signals indicative of the selected stable position or selected state of the switching circuit. A selector switch for specifying a line spacing on a typewriter is an example of such a position-hold switch.

Commonly, determination of an operated one of multiple key switches is accomplished by scanning a switch matrix wherein first and second signal lines cross each other so as to provide intersecting points, wherein the key switches are connected between the first signal lines and the second signal lines (row signal lines and column signal lines) at respective interacting points. Usually, the number of position-hold switches provided on a data input device is considerably smaller than that of the key switches. For this reason, determination of a selected position of the position-hold switch is made by using exclusive signal lines.

However, a circuit arrangement for detecting the operated key switches and the selected positions of the position-hold switches in the above manner tends to be complicated in the hardware due to the use of the exclusive signal lines and the detecting circuit for the position-hold switches, in addition to the switch matrix for the key switches and matrix scanning circuit.

SUMMARY OF THE INVENTION

It is accordingly an object of the present invention to provide a data input device which has a simplified hardware arrangement for detecting operations of key switches and selected positions of the position-hold switches.

The above object may be achieved according to the principle of the present invention, which provides a data input device having a plurality of key switches which produce corresponding output signals while the key switches are held in an operated position, and at least one position-hold switch which has a plurality of stable positions and is selectively placed in one of the stable positions, the data input device including a first matrix, a second matrix, and matrix scanning means. The first matrix comprises a plurality of first signal lines and a plurality of second signal lines. The first and second signal lines cross each other in a lattice, so as to provide intersecting points. Each of the key switches is connected between the first and second signal lines at a corresponding one of the intersecting points. The second matrix comprises at least one third signal line, and at least one fourth signal line which corresponds to the above-indicated at least one position-hold switch. The third and fourth signal lines cross each other in a lattice, so as to provide intersecting points. Each position-hold switch is connected between the third and fourth signal lines at a corresponding one of the intersecting points. At least one of the plurality of first signal lines of the first matrix acts as the above-indicated at least one third signal line, or at least one of the plurality of second signal lines acts as the above-indicated at least one fourth signal line. The matrix scanning means is adapted to scan the first matrix to thereby determine whether each of the plurality of key switches has been operated, and scan the second matrix to thereby determine a selected one of the plurality of stable positions of each position-hold switch, only when a scanning of the first matrix indicates that the number of the key switches which have been operated is equal to or smaller than a predetermined reference value.

In the data input device of the present invention constructed as described above, at least one of the first signal lines or at least one of the second signal lines of the first matrix for the key switches is utilized as the third signal line or lines or the fourth signal line or lines of the second matrix for the position-hold switch or switches. Consequently, the hardware for detecting the operations of the key switches and the selected positions of the position-hold switch or switches can be simplified as compared with that used in the known data input device.

The utilization of the signal lines of the first matrix as the signal line or lines of the second matrix can cause some problems where the key switches and the position-hold switch or switches are operated simultaneously. More specifically, the simultaneous operations of the switches may cause difficulty, failure or error in correctly determining the operated key switches or selected position of the position-hold switch. To avoid these problems, complicated determining or detecting means is required. The present invention provides a solution to these problems. That is, the matrix scanning means is adapted to scan the first matrix to determine the operated key switch or switches, and scan the second matrix to determine the selected stable position of the operated position-hold switch, only when the number of the key switches which have been operated is not greater than the predetermined reference value. This arrangement assures correct determination of the selected position of the position-hold switch, without using complicated determining or detecting means.

The predetermined reference value may be zero. In this case, the second matrix for the position-hold switch or switches is scanned only when none of the key switches has been operated. This arrangement does not cause an inconvenience in manipulating the data input device, since the operator usually stops operating the key switches when the operator wishes to operate the position-hold switch to change its selected position. The reference value is not limited to zero, but may be one or a larger value. If the reference value is one, for instance, the second matrix for the position-hold switch or switches is scanned where only one or none of the key switches has been operated.

According to one form of the data input device of the invention, the above-indicated at least one third signal line consists of a plurality of third signal lines, and each position-hold switch has three stable positions and corresponding three contacts. Two of the three contacts are connected to corresponding ones of the third signal lines of the second matrix, while the other one of the three contacts is connected to neither the third signal lines nor the fourth signal line or lines. Each position-hold switch has a movable contact which is selectively connectable to one of the three contacts which correspond to the three stable positions. The movable contact is connected to the above-indicated at least one fourth signal line.

In the above form of the invention, the matrix scanning means may include determining means for determining the above-indicated one of the three stable positions of the position-hold switch, by determining one of three states which consists of a first state in which one of the two contacts is at a high level while the other is at a low level, a second state in which the one of the two contacts is at a low level while the other contact is at a high level, and a third state in which both of the two contacts are at a same level. In this case, the matrix scanning means may further include: a status register for storing the determined one of the first, second and third states of the position-hold switch; discriminating means for determining whether the above-indicated one of the first, second and third states which is determined by the determining means is different from the state which is stored in the status register; and means for updating a content of the status register, when a decision made by the discriminating means is affirmative.

According to another form of the invention, the matrix scanning means comprises: first judging means for determining whether all of the plurality of key switches are placed in a non-operated position; second judging means for determining whether only one of the plurality of key switches is placed in the operated position; and second-matrix scanning means for scanning the second matrix, where a decision made by one of the first and second judging means is affirmative. In this instance, the matrix scanning means may further comprise a control flag which is set when an affirmative decision is made by the second judging means, and which is reset each time the second-matrix scanning means scans the second matrix. The second-matrix scanning means scans once the second matrix each time the second judging means makes the affirmative decision.

BRIEF DESCRIPTION OF THE DRAWINGS

The above and optional objects, features and advantages of the present invention will be better understood by reading the following detailed description of a preferred embodiment of the present invention in conjunction with the accompanying drawings, in which:

FIG. 5 is a flow chart depicting a scanning program stored in a read-only memory of the control system of FIG. 3.

DETAILED DESCRIPTION OF THE PREFERRED EMBODIMENT

Figure 1:
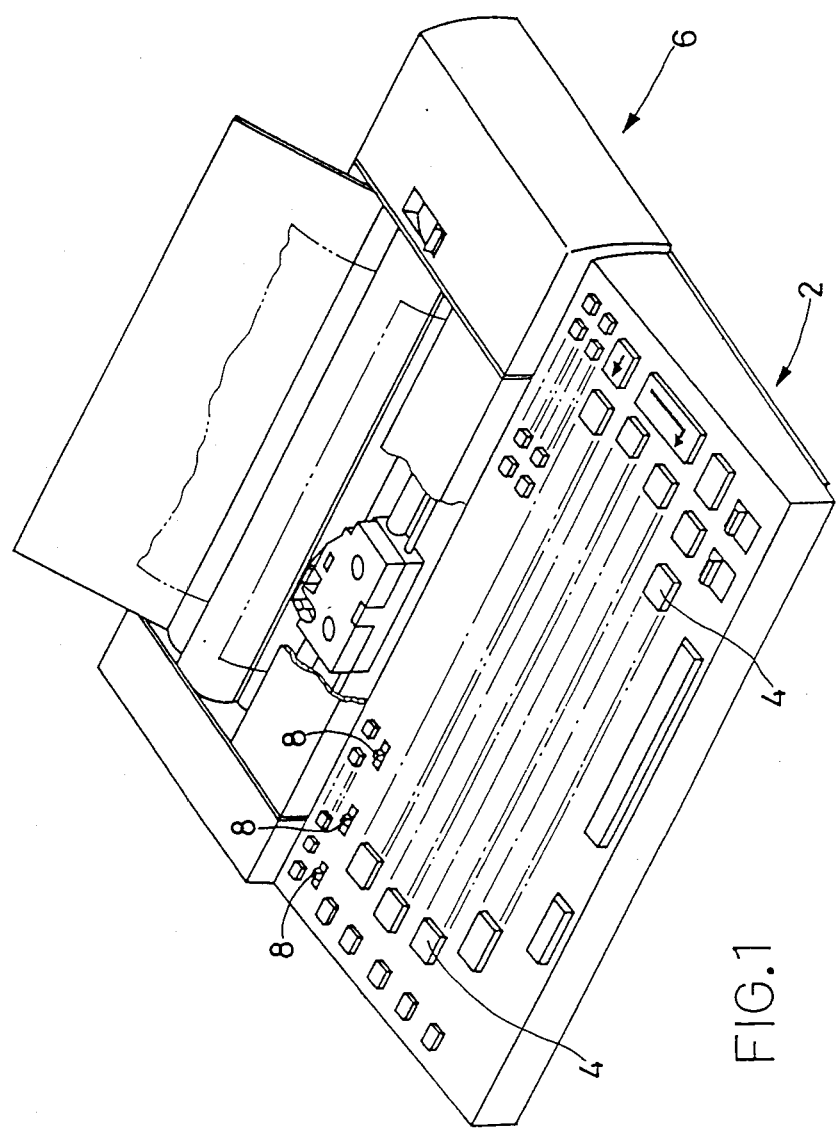
FIG. 1 is a perspective view showing an electronic typewriter using a presently preferred embodiment of a data input device of the present invention.

Referring first to FIG. 1, there is illustrated an electronic typewriter having a keyboard 2, which constitutes a major portion of the presently preferred form of the data input device according to the present invention. The keyboard 2 has a multiplicity of key switches 4 (such as character keys and function keys) which serve as control switches for operating the typewriter. The typewriter further has a printer 6 which is adapted to effect a printing operation according to print data entered through the keyboard 2. The key switches 4 produce corresponding output signals while the switches are held in their depressed or operated positions, and the output signals become absent when the switches are restored to their non-operated positions.

The keyboard 2 further has three slide switches 8, which function as position-hold switches. Each slide switch 8 has an operating knob shown in FIG. 1, and contacts which will be described. Each slide switch 8 has three stable states which correspond to three stable positions selected by the operator through the operating knob. The slide switches 8 may be used as selector switches such as a line spacing selector switch, a print pitch selector switch and a mode selector switch, depending upon the requirements of the specific typewriter.

Figure 2:
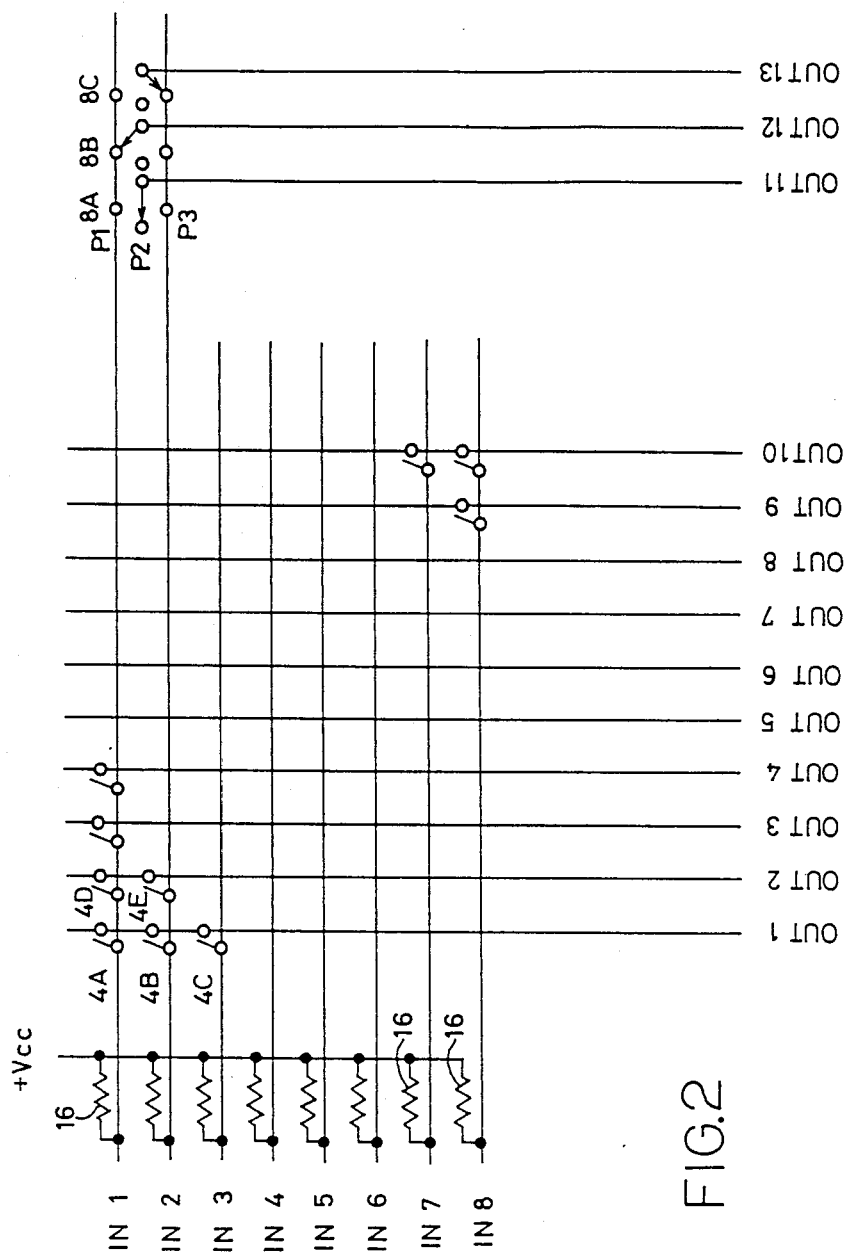
FIG. 2 is a schematic diagram illustrating switch matrices of a keyboard of the typewriter of FIG. 1.
Figure 3:
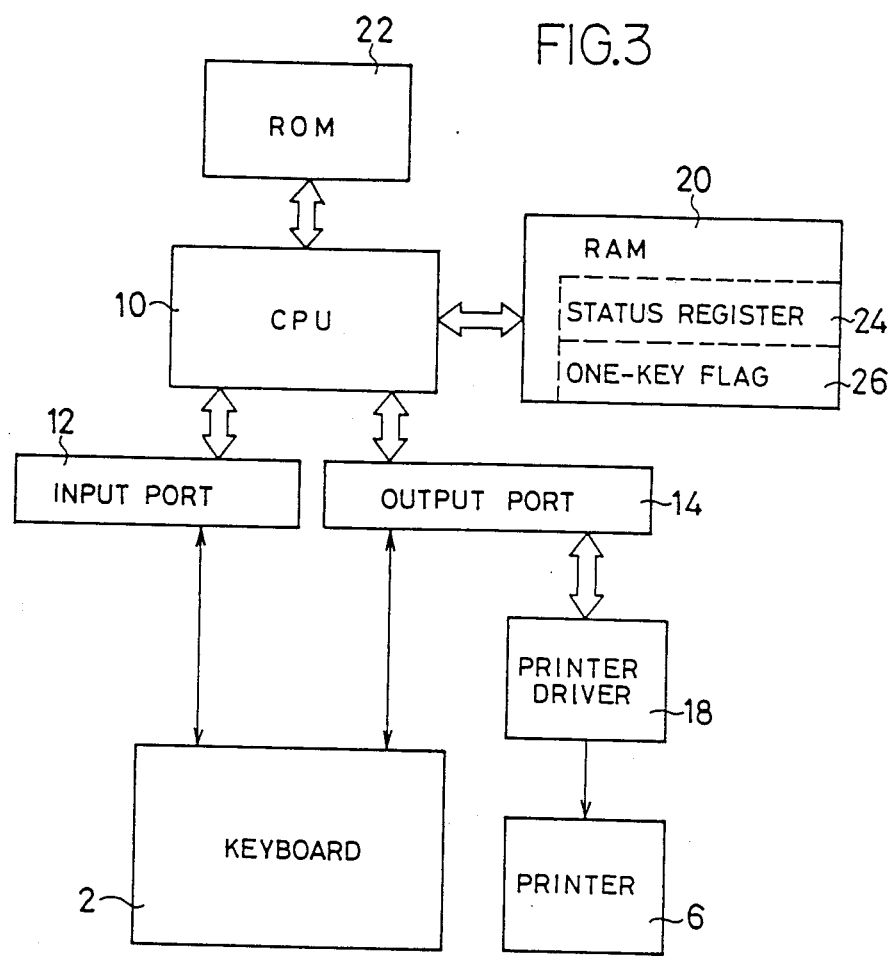
FIG. 3 is a block diagram showing a control system of the typewriter.
Figure 4:
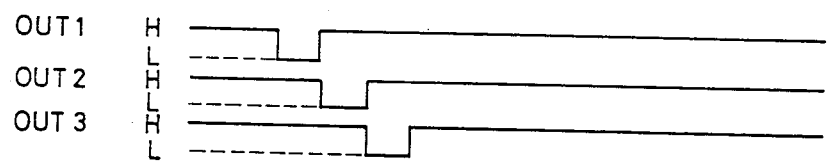
FIG. 4 is a timing chart explaining a manner of scanning part of the switch matrices of FIG. 2.

Referring next to the diagram of FIG. 2, there are illustrated a first matrix circuit for scanning the key switches 4, and a second matrix circuit for scanning the slide switches 8. The first matrix circuit consists of a plurality of first signal lines IN1-IN8 and a plurality of second signal lines OUT1-OUT10. The first and second signal lines cross each other in a lattice, so as to provide intersecting points, as indicated in FIG. 2. Contacts of the key switches 4 are connected between the first and second signal lines IN1-IN8, OUT1-OUT10, at the respective intersections. For convenience sake, the first signal lines IN1-IN8 and the second signal lines OUT1-OUT10 will be referred to as "row signal lines" and "column signal lines", respectively, according to the above matrix arrangement of the first and second signal lines arranged in rows and columns. Examples of the key switches thus connected to the first matrix circuit are indicated at 4A, 4B and 4C in FIG. 2. Although the contacts of the other key switches 4 are not shown in FIG. 2, these contacts are also connected to the respective intersections. As indicated in FIG. 3, the row signal lines IN1-IN8 are connected to an input port 12 of a CPU 10 (central processing unit) of the control system, while the column signal lines OUT1-OUT10 are connected to an output port 14 of the CPU 10. Hereafter, the first matrix circuit is simply called the first matrix.

All the row signal lines IN1-IN8 of the first matrix are maintained at a high (H) level in the presence of a line voltage Vcc and a pull-up resistor 16, while the keyboard 2 is on. Normally, high (H) level output signals are present at the column signal lines OUT1-OUT10. When the first matrix is scanned, however, a low (L) level signal is sequentially applied to the column signal lines OUT1-OUT10. When the low level signal is applied to each of the column signal lines, the levels of the signals at the row signal lines IN1-IN8 are checked to determine whether the level of the signal of any row line IN1-IN8 is changed from the H level to the L level, to thereby determine whether any one of the key switches 4 has been operated.

The result of the scanning of the first matrix, i.e., the determination of the operated key switches 4 is valid only when the number of the simultaneously operated key switches 4 is two or smaller. If the three or more key switches 4 are operated simultaneously, the determination of the operated key switches 4 is not effected, and the output signals of the operated switches 4 are ignored. Assuming, for example, that the key switches 4A, 4B and 4D are operated simultaneously, the levels of the signal lines IN1 and IN2 are both low when the L-level signal is applied to the signal line OUT1. Thus, the simultaneous operations of the two key switches 4A and 4B can be detected. When the L-level signal is then applied to the signal line OUT2, however, the level of the signal line IN2 becomes low due to the connection of the operated key switches 4A and 4B, as well as the level of the signal line IN1 becomes low. This means an erroneous determination that the key switch 4E which has not in fact been operated has been operated. For this reason, the determination of the operated keys 4 is not effected if the number of the simultaneously operated keys 4 exceeds a predetermined value of two. This arrangement permits scanning of the operated key switches 4, without otherwise required diodes for the key switches 4 which would complicate the hardware of the control system.

The second matrix circuit for scanning the slide switches 8 (indicated at 8A, 8B and 8C in FIG. 2) consists of two third signal lines IN1 and IN2 which consist of the first signal lines of the first matrix, and fourth signal lines OUT11, OUT12 and OUT13. Namely, the first signal lines IN1 and IN2 of the first matrix are commonly used as the row signal lines for the first and second matrices. The third and fourth signal lines cross each other, so as to provide intersecting points. Like the key switches 4, the slide switches 8 are connected between the third and fourth signal lines IN1, IN2, OUT11-OUT13 at the respective intersections. For convenience sake, the third and fourth signal lines IN1-IN2 and OUT11-OUT13 will be referred to as "row signal lines" and "column signal lines". For instance, the slide switch 8A has three contacts P1, P2 and P3. The contacts P1 and P3 are connected to the row signal lines IN1 and IN2, while the contact P2 serves as a neutral contact which is connected to neither the row signal line IN1 nor the row signal line IN2. The slide switch 8A has a movable contact which is connected to the column signal line OUT11. The movable contact is connected selectively to one of the three contacts P1, P2, P3 when the switch 8A is placed in one of the three stable positions. The slide switches 8B and 8C have a similar arrangement with respect to the respective column signal line OUT12, OUT13 of the second matrix. Thus, the second matrix for the slide switches 8 is constructed.

Like the column signal lines OUT1-OUT10 of the first matrix, the column signal lines OUT11-OUT13 of the second matrix are connected to the output port 14 of the CPU 10. To determine the operated slide switch or switches 8A, 8B, 8C, the L-level signal is sequentially applied to the column signal lines OUT11-OUT13. When the L-level signal is applied to each of the signal lines OUT11-OUT13, the CPU 10 determines the levels (H or L) of the row signal lines IN1 and IN2, and thereby determines the currently selected position of the operated slide switches 8A, 8B, 8C. Described more specifically, the CPU 10 determines that the slide switch 8A is placed in the position corresponding to the contact P1, if the levels of the signal lines IN1, IN2 are low and high, respectively, while the L-level signal is present at the signal line OUT 11. Similarly, the CPU 10 determines that the slide switch 8A is placed in the position corresponding to the contact P3, if the levels of the signal lines IN1, IN2 are high and low, respectively. Further, the CPU 10 determines that the slide switch 8A is placed in the position corresponding to the contact P2, if the levels of the signal lines IN1, IN2 are both high.

Where the two or more key switches 4 are operated simultaneously, the determination of the operated slide switches 8 by the scanning of the second matrix may be erroneous. For instance, if the key switches 4A and 4B are simultaneously operated while the slide switch 8A is placed in the position corresponding to the contact P1, the levels of the signal lines IN1 and IN2 are both low with the L-level signal applied to the signal line OUT11. In this case, the CPU 10 cannot determine whether the slide switch 8A is placed in the position P1 or P3. Therefore, this situation should be avoided.

Referring to FIG. 3, the output port 14 is connected to the printer 6 via a printer driver 18, and a RAM 20 (random-access memory) and a ROM 22 (read-only memory) are connected to the CPU 10. The RAM 20 has various registers and buffers such as a STATUS register 24 for storing the selected positions of the slide switches 8A, 8B and 8C, and a ONE-KEY flag 26 which represents whether only one of the key switches 4 has been operated. The ROM 22 stores control programs for controlling actions of the typewriter, and a control program for scanning the first and second matrices for detecting the operations of the key switches 4 and the slide switches 8. The scanning control program is represented by the flow chart of FIG. 5.

Referring to FIG. 5, the matrix scanning routine will be described. Initially, the control flow goes to step S1 for performing a predetermined initializing operation. Then, the control flow goes to step S2 to scan the first matrix for the key switches 4. Step S2 is followed by step S3. In step S3, the CPU 10 determines whether any one of the key switches 4 has been operated, i.e., whether the level of any one of the row signal lines IN1–IN8 has been changed from high to low. If none of the key switches 4 has been operated, the control flow goes to step S8 to scan the second matrix for the slide switches 8, by utilizing the row signal lines IN1, IN2 and the column signal lines OUT11–OUT13. Step S8 is followed by step S9 wherein the CPU 10 determines whether the detected current states of the row signal lines IN1 and IN2 are different from the last states which are stored in the STATUS register 24. If the detected current states are the same as the last states, then the control flow goes back to step S2. If the state of any slide switch 8, for example, slide switch 8A, has been changed, step S9 is followed by step S10 in which the output signal of the operated slide switch 8A is processed, and the content of the STATUS register 24 is updated.

If the determination in step S3 reveals that any key switch 4 has been operated, step S4 is executed to determine whether only one of the key switches 4 has been operated, or not. If an affirmative decision (YES) is obtained, the control flow goes to step S6, via step S5 wherein the ONE-KEY flag 26 is set. If a negative decision (NO) is obtained in step S4, that is, if two or more key switches 4 have been operated simultaneously, the control flow goes to step S6, skipping step S5. In step S6, the output signal of the operated key switch 4 is processed, to print the data entered by the switch 4, for example. In the next step S7, the CPU 10 determines whether the ONE-KEY flag 26 is in the set state. If the CPU 10 determines that the flag 26 is in the set state, step S7 is followed by step S11 wherein the ONE-KEY flag 26 is reset. Then, the control flow goes to step S8 and subsequent steps, in the same manner as implemented where none of the key switches 4 are operated.

It follows from the foregoing description that the present embodiment is adapted such that the second matrix for the slide switches 8 will be scanned where none of the key switches 4 are operated, or where only one of the key switches 4 is operated. If the two or more key switches 4 are operated, the second matrix for the slide switches will not be scanned. Therefore, the instant matrix scanning 8 arrangement will not suffer from a scanning failure or error, even though the signal lines IN1 and IN2 are commonly used as the row signal lines (first and third signal lines) of the first and second matrices. It will be understood that the portion of the ROM 20 which stores the control program illustrated in FIG. 5, and the CPU 10 which executes that control program, cooperate to constitute a principal portion of matrix scanning means for scanning the first matrix and thereby determining whether each of the key switches 4 is operated, and for scanning the second matrix and thereby determining one of the stable positions in which each slide switch 8 is placed, only when the scanning of the first matrix indicates that none or only one of the key switches 4 has been operated.

It is possible that the second matrix for the slide switches 8 is not scanned if any one of the key switches 4 has been operated. Namely, the second matrix is scanned only where none of the key switches 4 has been operated.

In the illustrated embodiment, each of the three slide switches 8A, 8B and 8C has three selectable stable positions. However, the number of the slide switches 8, and the number of the stable positions of the slide switches may be selected as needed. Further, the slide switches 8 may be replaced by other types of position-hold switches such as toggle switches, rotary switches, or an alternate-action pushbutton switch which is placed in one position by one pressing action, and placed in another position by another pressing action, such that the newly selected position is maintained even after an operating force acting on the switch is released.

It will be understood that the present invention may be embodied with various other changes and modifications which may occur to those skilled in the art, without departing from the spirit and scope of the invention defined in the following claims.

What is claimed is:

1. A data input device having a plurality of key switches which produce corresponding output signals while the key switches are held in an operated position, and at least one position-hold switch each of which has a plurality of stable positions and is selectively placed in one of said stable positions, comprising:

a first matrix comprising a plurality of second signal lines, said first and second signal lines crossing each other in a lattice, so as to provide first intersecting points, each of said key switches being connected between said first and second signal lines at a corresponding one said first intersecting points;

a second matrix comprising at least one third signal line, and at least one fourth signal lines which corresponds to said at least one position-hold switch, said at least one third signal line and said at least one fourth signal line crossing each other in a lattice, so as to provide second intersecting points, each of said at least one position-hold switch being connected between said third and fourth signal lines at a corresponding one of said second intersecting points, at least one of said plurality of first signal lines of said first matrix or at least one of said plurality of second signal lines acting as said at least one third signal line or said at least one fourth signal line, respectively, and matrix scanning means for scanning said first matrix and thereby determining whether each of said plurality of key switches has been operated, and then scanning said second matrix and thereby determining one of said plurality of stable positions in which each said position-hold switch is placed, only when a scanning of said first matrix indicates that the number of said key switches which has been operated is equal to or smaller than a predetermined reference value.

2. A data input device according to claim 1, wherein said predetermined reference value is zero.

3. A data input device according to claim 1, wherein said at least one third signal line consists of a plurality of third signal lines, and each said position-hold switch has three stable positions and three corresponding three contacts, two contacts of said three contacts being connected to corresponding ones of said plurality of third signal lines of said second matrix, while the other one of said three contacts being connected to neither said third signal lines nor said at least one fourth signal line, each said position-hold switch having a movable contact which is selectively connectable to one of said three contacts corresponding to said three stable positions, said movable contact being connected to said at least one fourth signal line.

4. A data input device according to claim 3, wherein said matrix scanning means includes determining means for determining said one of three stable positions of each said position-hold switch, by determining one of three states which consists of a first state in which one of said two contacts is at a high level while the other is at a low level, a second state in which said one of the two contacts is at a low level while said other contact is at a high level, and a third state in which both of said two contacts are at the same level.

5. A data input device according to claim 4, wherein said matrix scanning means further includes;

a status register for storing said one of said first, second and third states of each said position-hold switch;

discriminating means for determining whether said one of the first, second and third states which is determined by said determining means is different from the state which is stored in said status register; and means for updating a content of said status register, when a decision made by said discriminating means is affirmative.

6. A data input device according to claim 1, wherein said matrix scanning means comprises:

first judging means for determining whether all of said plurality of key switches are placed in a non-operated position;

second judging means for determining whether only one of said plurality of key switches is placed in said operated position; and second-matrix scanning means for scanning said second matrix, when a decision made by one of said first and second judging means is affirmative.

7. A data input device according to claim 6, wherein said matrix scanning means further comprises a control flag which is set when an affirmative decision is made by said second judging means, and which is reset each time said second-matrix scanning means scans said second matrix, said second-matrix scanning means scans said second matrix each time said second judging means makes the affirmative decision.

8. A data input device having a plurality of key switches which produce corresponding output signal while the key switches are held in an operated position, and at least one position-hold switch each of which has a plurality of stable positions and is selectively placed in one of said stable positions, comprising:

a first matrix comprising a plurality of first signal lines and a plurality of second signal lines, said first and second signal lines crossing each other in a lattice, so as to provide first intersecting points, each of said key switches being connected between said first and second signal lines at a corresponding one of said first intersecting points;

a second matrix comprising at least one third signal line, and at least one fourth signal line which corresponds to said at least one position-hold switch, said at least one third signal line and said at least one fourth signal line crossing each other in a lattice, so as to provide second intersecting points, each of said at least one position-hold switch being connected between said third and fourth signal lines at a corresponding one of said second intersecting points, at least one of said plurality of first signal lines of said first matrix or at least one of said plurality of second signal lines acting as said at least one third signal line or said at least one fourth signal line, respectively; and matrix scanning means for scanning said first matrix and thereby determining whether each of said plurality of key switches has been operated, and for scanning said second matrix and thereby determining one of said plurality of stable positions in which each said position-hold switch is placed, only when a scanning of said first matrix indicates that only one or none of said key switches has been operated.

* * * * *